United States Patent
Leopardi et al.

(10) Patent No.: US 10,044,454 B2
(45) Date of Patent: Aug. 7, 2018

(54) AUDIO HUB APPARATUS AND SYSTEM

(71) Applicant: DIRECT SOUND, LLC, Saint Louis, MO (US)

(72) Inventors: Emmett Jay Leopardi, Hellertown, PA (US); Stephen J. Rois, Saint Louis, MO (US); Peter J. Janssen, Lincoln, CA (US)

(73) Assignee: Direct Sound, LLC, St. Louis, MO (US)

( * ) Notice: Subject to any disclaimer, the term of this patent is extended or adjusted under 35 U.S.C. 154(b) by 0 days.

(21) Appl. No.: 15/167,446

(22) Filed: May 27, 2016

(65) Prior Publication Data

US 2017/0346581 A1 Nov. 30, 2017

(51) Int. Cl.
*G10H 1/08* (2006.01)
*H04H 60/05* (2008.01)
*G10H 1/00* (2006.01)
*H04R 3/00* (2006.01)
*H03G 9/12* (2006.01)

(52) U.S. Cl.
CPC .......... *H04H 60/05* (2013.01); *G10H 1/0033* (2013.01); *H03G 9/12* (2013.01); *H04R 3/005* (2013.01); *G10H 2240/175* (2013.01); *G10H 2240/211* (2013.01); *H04R 2420/09* (2013.01)

(58) Field of Classification Search
CPC ................. G10H 1/08; H01L 24/00
USPC .............. 455/3.01, 419, 434, 551; 700/1
See application file for complete search history.

(56) References Cited

U.S. PATENT DOCUMENTS

| | | | |
|---|---|---|---|
| 9,332,295 B2 * | 5/2016 | Chang | H01L 24/00 |
| 2008/0065233 A1 * | 3/2008 | Igoe | H04L 12/2809 |
| | | | 700/1 |
| 2012/0324047 A1 * | 12/2012 | Diner | H04L 65/403 |
| | | | 709/217 |

* cited by examiner

*Primary Examiner* — John J Lee
(74) *Attorney, Agent, or Firm* — The Concept Law Group, PA; Scott D. Smiley; Scott M. Garrett

(57) ABSTRACT

An audio hub is disclosed including a plurality of daughterboards and a mainboard communicatively coupled to each of the plurality of daughterboards. Each of the plurality of daughterboards is associated with an audio channel and each audio channel is independent from the other of the audio channels associated with the other ones of the plurality of daughter boards. Further, each daughterboard includes at least one wireless transceiver operably configured to wirelessly transmit an audio signal associated with the corresponding audio channel from a musical instrument over a network to the audio playback device. The mainboard is configured so that, for each of the plurality of daughterboards, the mainboard is operable to independently modify at least one characteristic of the audio signal from the musical instrument before the audio signal is transmitted to the audio playback device.

20 Claims, 14 Drawing Sheets

102

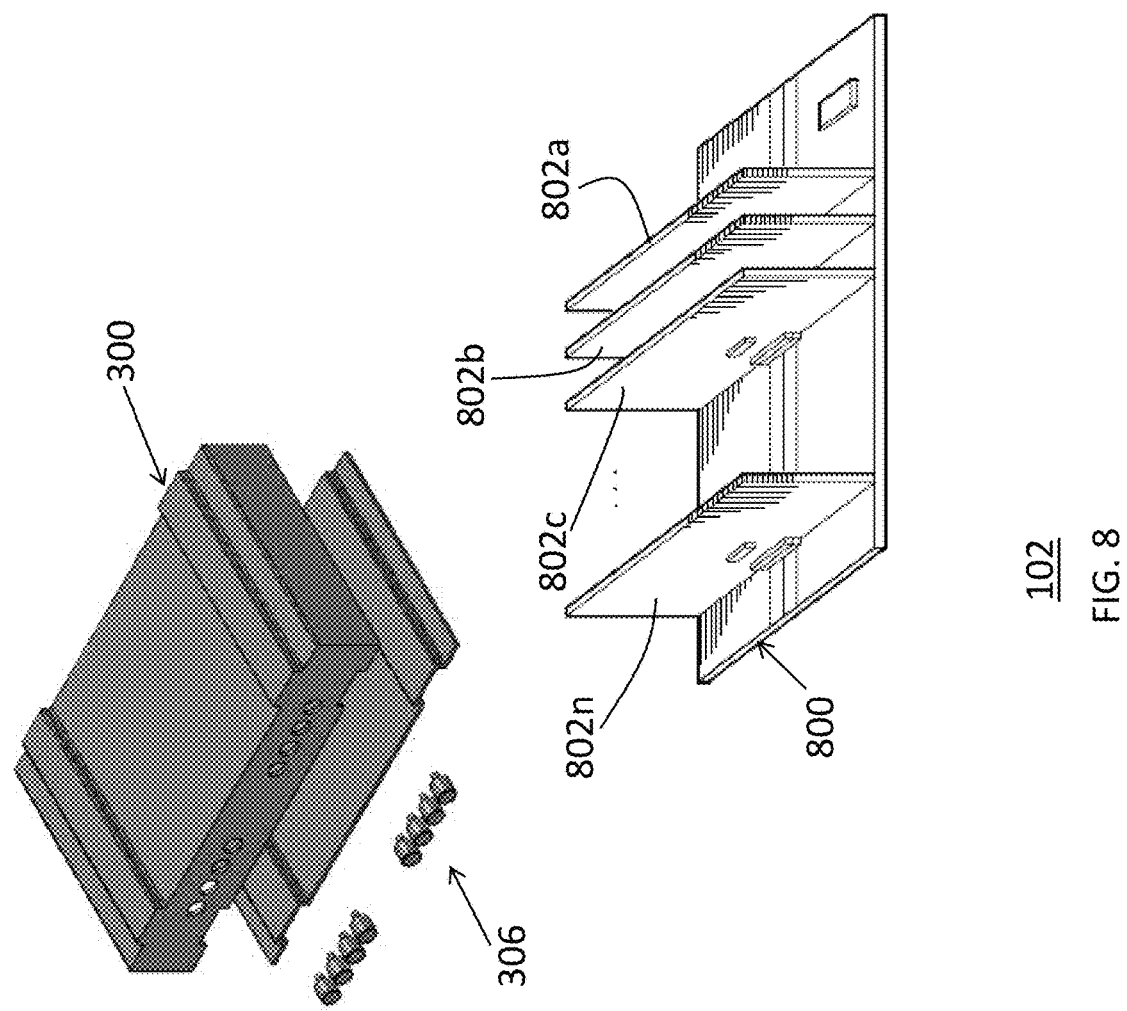

102

104

104

AUDIO HUB APPARATUS AND SYSTEM

FIELD OF THE INVENTION

The present invention relates generally to musical instrument systems and devices, and, more particularly, relates to an apparatus and system for independently modifying audio signals from musical instruments and transmitting the audio signals via an audio hub.

BACKGROUND OF THE INVENTION

It is known that musical compositions include a combination of audio signals from various musical instruments, including but not limited to guitars, microphones, drums, and the like. Musicians conduct rehearsals to improve and perfect their sound. Unfortunately, these rehearsals can be relatively loud and may be considered audibly intrusive by others, such as, for example, neighboring residences and businesses. Accordingly, rehearsals can be conducted "silently," through headphones. However, existing apparatuses for conducting "silent" rehearsals through headphones do not allow individual musicians to independently modify his/her own audio input, independent of the audio input to the other musicians and to allow such independently modified audio signals to be communicated wirelessly in a flexible and secure manner.

In addition, it is increasingly common for musicians and their producers to be located long distances from one another (e.g., in different cities or states). Unfortunately, prior art methods for allowing such musicians to rehearse and/or such producers to produce require the individuals to be within the same location. Stated another way, prior art methods do not allow individuals to rehearse and/or record remotely, e.g., over long distances, while maintaining high-quality sound, secure wireless transmissions, individual control over assigned audio channels, and a significant expandability of the number of audio inputs.

Therefore, a need exists to overcome the problems with the prior art as discussed above.

SUMMARY OF THE INVENTION

The invention provides an audio hub apparatus and system that overcomes the hereinafore-mentioned disadvantages of the heretofore-known devices and methods of this general type.

With the foregoing and other objects in view, there is provided, in accordance with the invention, an audio hub having a plurality of daughterboards, each of the plurality of daughterboards: associated with an audio channel and each audio channel is independent from audio channels associated with other ones of the plurality of daughterboards; communicatively couplable to a musical instrument and an audio playback device; and including at least one wireless transceiver operably configured to wirelessly transmit an audio signal associated with the audio channel from the musical instrument over at least one of the Internet and a LAN to the audio playback device. The audio hub may further include a mainboard communicatively coupled to each of the plurality of daughterboards and configured so that, for each of the plurality of daughterboards, the mainboard is operable to independently modify at least one characteristic of the audio signal from the musical instrument before the audio signal is transmitted to the audio playback device.

In accordance with another feature, an embodiment of the present invention also includes a stackable housing substantially enclosing the mainboard and the plurality of daughterboards, the stackable housing including an exterior surface portion shaped to matingly engage at least one mating surface portion disposed on an adjacent audio hub.

In accordance with yet another feature, an embodiment of the present invention may also include a housing substantially enclosing the mainboard and the plurality of daughterboards; and a plurality of audio input ports disposed on the housing, each audio input port operably configured to receive at least one conductor couplable to a mixing board.

In accordance with another feature of the present invention, the mainboard is further operable to selectively combine at least a portion of the independently modified audio signals into a mixed audio signal and transmit the mixed audio signal to at least one of the plurality of daughterboards for wireless transmission of said mixed audio signal over the at least one of the Internet and the LAN.

In accordance with yet another feature of the present invention, the mainboard is further operable to, for each of the plurality of daughterboards, independently modify the at least one characteristic of the audio signal associated with the corresponding audio channel as a result of a user command wirelessly received via a software application running on a mobile device corresponding to the daughterboard, the mobile device wirelessly communicatively coupled to the audio hub.

In accordance with an additional feature of the present invention, each of the plurality of daughterboards is operable to receive a microphone output from a corresponding audio playback device in addition to the audio signal from a corresponding musical instrument.

In accordance with yet an additional feature of the present invention, each of the plurality of daughterboards is disposed physically parallel with one another and oriented substantially perpendicular with respect to the mainboard.

In accordance with another feature of the present invention, the wireless transceiver included in each of the plurality of daughterboards includes a first wireless transceiver communicating with a Bluetooth protocol and a second wireless transceiver communicating with a Wi-fi protocol.

In accordance with yet another feature of the present invention, the characteristic of the audio signal is a volume of the audio signal.

In accordance with yet another feature of the present invention, the characteristic of the audio signal is at least one of a gain of the audio signal.

In accordance with another feature, an embodiment of the present invention includes an audio hub system with a plurality of musical instrument dongles, each of the plurality of musical instrument dongles couplable to a musical instrument and including at least one transceiver operably configured to transmit an audio signal from the musical instrument, over at least one of the Internet and a LAN; and an audio hub. The audio hub may include a plurality of daughterboards, each of the plurality of daughterboards associated with one of the plurality of musical instrument dongles and including at least one transceiver operably configured to receive the audio signal from an associated musical instrument dongle over the at least one of the Internet and the LAN, and a mainboard communicatively coupled to each of the plurality of daughterboards and operable to independently modify at least one characteristic of each audio signal received from the plurality of musical instrument dongles.

In accordance with a further feature of the present invention, each of the plurality of daughterboards is associated with one of the plurality of musical instrument dongles by a unique identifier.

In accordance with another feature, an embodiment of the present invention further includes a plurality of user mobile devices each running an instance of a software application, each instance of the software application associated with a user account and each user account associated with one of the plurality of daughterboards and operably configured to allow a user to transmit a user-command to independently modify the at least one characteristic of the audio signal received by the associated daughterboard over the at least one of the Internet and the LAN.

In accordance with yet another feature, only one user account is a producer user account that is operable to override the user-command with a producer-command to modify the at least one characteristic of the audio signal.

In accordance with another feature of the present invention, the audio hub includes at least one MOLEX connector; and each of the plurality of musical instrument dongles includes a MOLEX connector.

In accordance with another feature of the present invention, each of the plurality of musical instrument dongles includes a WPS button.

In accordance with another feature of the present invention, the wireless transceiver included in each of the plurality of daughterboards and each of the plurality of musical instrument dongles has a first wireless transceiver operably configured to communicate with a Bluetooth protocol and a second wireless transceiver operably configured to communicate with a Wi-fi protocol.

In accordance with yet another feature, an embodiment of the present invention further includes a plurality of audio playback devices each operable to receive a modified audio signal from an associated daughterboard, the modified audio signal resulting from the mainboard independently modifying the at least one characteristic of the audio signal.

In accordance with an additional feature of the present invention, the mainboard is further operable to selectively combine one or more of the independently modified audio signals into a mixed audio signal and transmit the mixed audio signal to at least one of the plurality of daughterboards for wireless transmission of said mixed audio signal over the at least one of the Internet and the LAN.

In accordance with a further feature of the present invention, each of the plurality of musical instrument dongles includes an analog-to-digital converter.

Although the invention is illustrated and described herein as embodied in an audio hub apparatus and system, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale.

Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. In this document, the term "longitudinal" should be understood to mean in a direction corresponding to an elongated direction of the audio hub. The terms "program," "software application," and the like as used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

FIG. 8 is an exploded view of the exemplary audio hub of FIG. 3, illustrating a housing, a mainboard, and a plurality of daughterboards, in accordance with the present invention;

DETAILED DESCRIPTION

Figure 1:
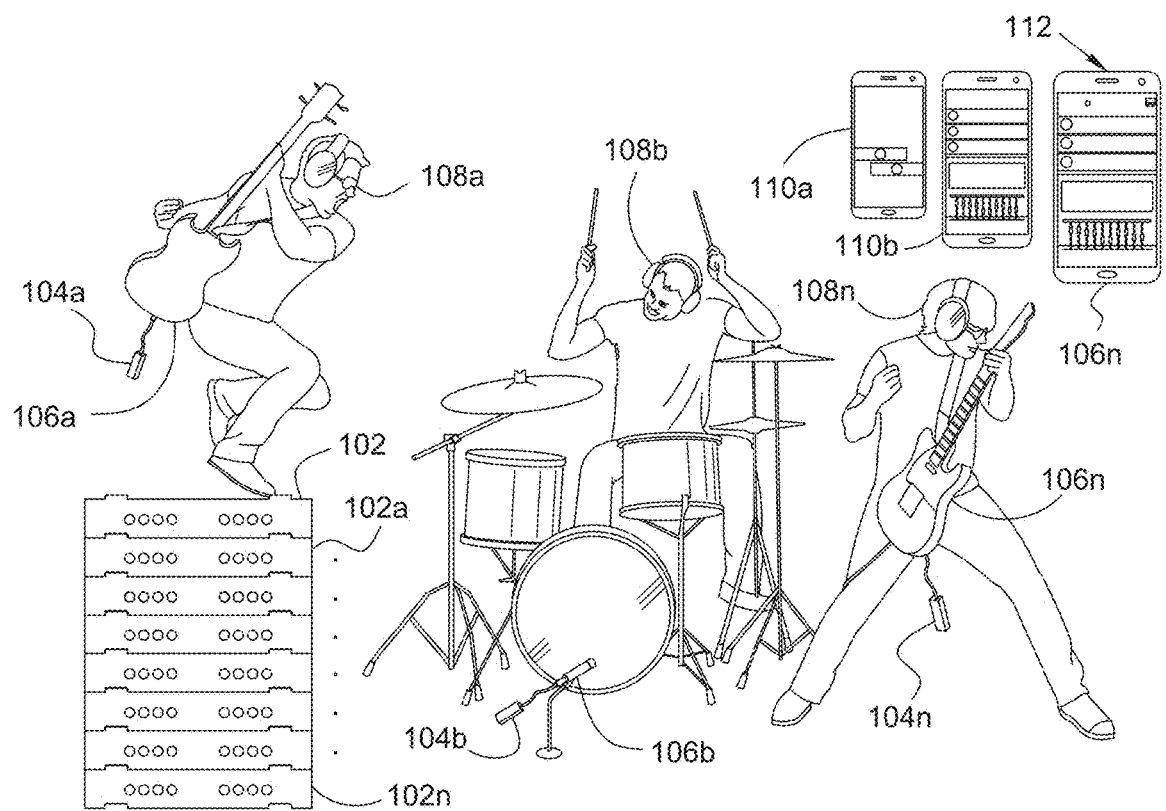
FIG. 1 is a schematic diagram of an exemplary audio hub system, in accordance with an embodiment of the present invention.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

The present invention provides a novel and efficient audio hub that facilitates wireless transmission of audio signals from instruments connected to the audio hub to user headphones. Embodiments of the invention may provide an audio hub that is configured to wirelessly transmit audio signals from instruments to the corresponding musician's headphones for silent rehearsals. In addition, embodiments of the present invention provide an audio hub with a plurality of daughterboards, where each daughterboard is associated with an independent audio channel and may be further associated with a corresponding user headset/headphones, a corresponding user instrument, and/or a corresponding user mobile device. In a further embodiment, each user mobile device runs an instance of a software application with a unique user account that allows the user to modify the user's audio channel output to the user's headset (e.g., turn up the user's volume, or modify the user's audio to playback with an increased gain, etc.) during the silent rehearsal. In other words, each user's headset may receive an independent audio signal that the user can selectively modify through his/her mobile device (and which may not affect the audio signal received by any of the other musician's headsets). In a further embodiment, each daughterboard is coupled to a main board that processes the audio signals on each independent audio channel and is operable to independently modify each independent audio signal (e.g., volume, gain, etc.) and transmit such modified audio signal to the corresponding daughterboard for transmission to the corresponding user's headset.

In addition, embodiments of the invention provide an inventive musical instrument dongle that connects to an input port on the musical instrument and allows the audio signal from the musical instrument to be wirelessly transmitted to the audio hub. The audio hub may subsequently independently process each audio signal from each instrument according to user commands and transmit each independently modified audio signal to the corresponding user's headset. In other embodiments, daughterboards can also receive audio signals from the headset's microphone and broadcast such audio signals to one or more selected headsets to facilitate conversations during the silent rehearsal.

FIG. 1 shows several advantageous features of the present invention, but, as will be described below, the invention can be provided in several shapes, sizes, combinations of features and components, and varying numbers and functions of the components. The first example of an audio hub system 100, as shown in FIG. 1, includes an audio hub 102, a plurality of musical instrument dongles 104a-n, a plurality of musical instruments 106a-n, a plurality of audio playback devices 108a-n, and a plurality of mobile devices 110a-n. It is understood that the number of dongles, instruments, and audio playback devices between "a" and "n" can be any number.

In one embodiment, each musical instrument dongle 104a-n is associated with a corresponding musical instrument 106, an audio playback device 108, and a mobile device 110 of a unique user/musician. The audio hub 102 may be communicatively coupled to each such user device for facilitating wireless transmission of audio signals from the musical instruments 106a-n to corresponding audio playback devices 108a-n so that users can listen to the audio on their own independent channel during a silent rehearsal. In further embodiments, users can independently modify their own channel via a software application ("app") running on their mobile device 110. Accordingly, users can independently modify audio characteristics of their own audio playback during silent rehearsals, without modifying the audio characteristics of other participants of the silent rehearsal.

In another embodiment, the audio hub system 100 may include a plurality of audio hubs 102a-n that are stackable one on top of the other. In other embodiments, the plurality of audio hubs 102a-n may be physically (and sometimes communicatively) couplable in other ways. It is understood that the number of audio hubs between "a" and "n" can be any number. Advantageously, the audio hub system 100 may be configured for virtually unlimited expandability of audio channels, as will be explained in more detail herein below.

Figure 2:
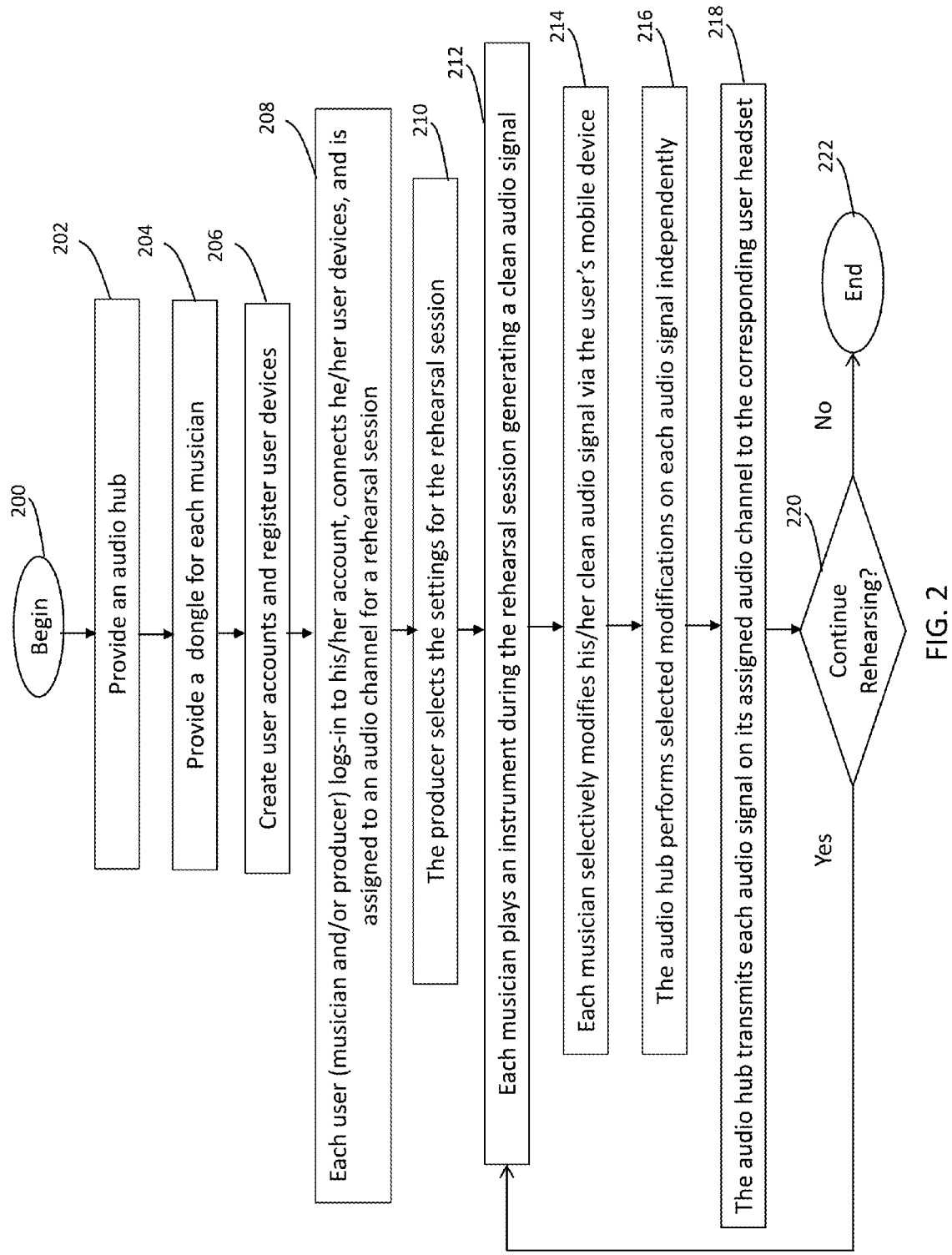
FIG. 2 is a process flow chart representing an exemplary method of conducting a silent rehearsal in accordance with the present invention.
Figure 3:
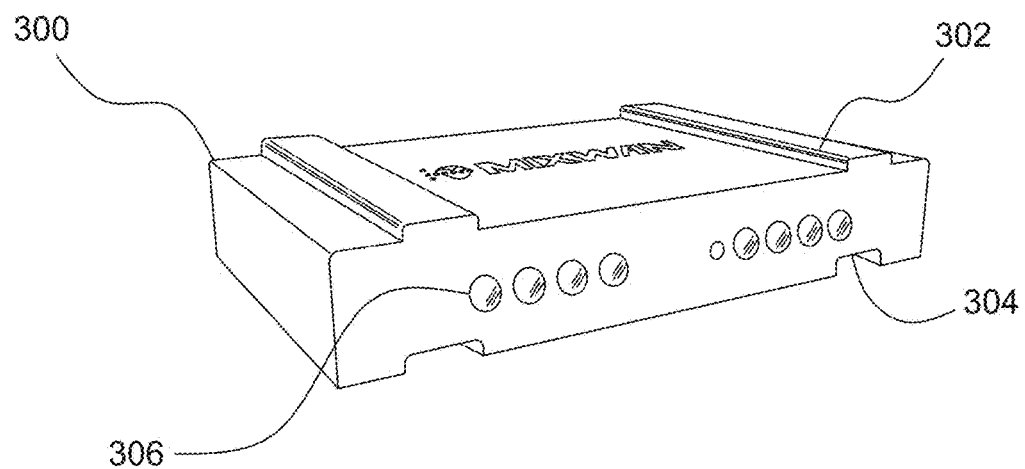
FIG. 3 is a right front perspective view of an exemplary audio hub in accordance with the present invention.
Figure 6:
FIG. 6 is an elevational front view of the exemplary audio hub of FIG. 3 in accordance with an embodiment of the present invention.
Figure 7:
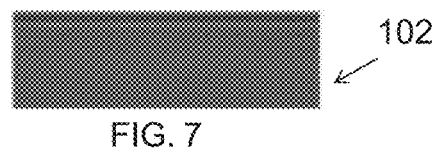
FIG. 7 is an elevational side view of the exemplary audio hub of FIG. 3 in accordance with an embodiment of the present invention.
Figure 5:
FIG. 5 is an elevational rear view of the exemplary audio hub of FIG. 3 in accordance with the present invention.
Figure 4:
FIG. 4 is a top plan view of the exemplary audio hub of FIG. 3 in accordance with the present invention.

The following figures will be described in conjunction with the process flow chart of FIG. 2. Although FIG. 2 shows a specific order of executing the process steps, the order of executing the steps may be changed relative to the order shown in certain embodiments. Also, two or more blocks shown in succession may be executed concurrently or with partial concurrence in some embodiments. Certain steps may also be omitted in FIG. 2. In some embodiments, some or all of the process steps included in FIG. 2 can be combined into a single process step.

The process of FIG. 2 begins at step 200 and moves directly to step 202, where a user provides at least one audio hub 102. This step is illustrated in FIGS. 3-7, which show the exemplary audio hub 102 in a perspective front view, a top plan view, a rear elevational view, a front elevational view, and a side view, respectively.

Physically, the audio hub 102 may include a housing 300. In one embodiment, the housing 300 can be considered a stackable housing 300. In other words, the housing 300 may include an exterior surface portion 302 shaped to matingly engage at least one mating surface portion 304 disposed on an adjacent audio hub 102. Such stackable housing configuration can be seen in FIG. 1, which illustrates a tower of stackable audio hubs 102a-n. In the exemplary embodiment, the exterior surface portion 302 is shaped as a male portion or a protrusion. The stackable housing 300 also includes the mating surface portion 304, which may be shaped as a female portion or indentation. The exterior surface portion 302 may be shaped to mate with the mating surface portion 304 to provide a streamlined appearance and efficient storage when stacking audio hubs 102 together, while also providing a stable physical coupling of adjacent audio hubs 102. Advantageously, the audio hubs 102 can be stacked together in order to provide more audio channels than would be available with a single audio hub 102. In one embodiment, the exterior surface portion 302 may be configured to provide a friction fit into the mating surface portion 304. In other embodiments, the housing 300 may include more than one exterior surface portion 304 and more than one mating surface portion 304. In yet other embodiments, the housing 300 may be physically couplable to other audio hub housings 300 in other ways and with other types of connections.

In one embodiment, the housing 300 may be of a rigid to semi-rigid material. In a further embodiment, the housing 300 may be made of a polymer-based material, such as plastic. In other embodiments, the housing 300 may be made of other materials. In one embodiment, the housing 300 may be generally rectangular-shaped. In another embodiment, the housing 300 may be circular-shaped. In yet other embodiments, the housing 300 may be formed as other shapes and sizes.

In one embodiment, the audio hub 102 may include an external light indicator 306 for each independent audio channel disposed on the housing 300 and externally viewable. The external light indicators 306 may indicate a status of each corresponding audio channel. The status indicated by the light indicator 306 may be, for example, whether the corresponding audio channel is operating properly or is currently inoperable (e.g., in error). In other embodiments, the light indicator 306 may indicate whether the corresponding audio channel is currently in use. In other embodiments, the light indicator 306 may indicate other status items associated with the corresponding audio channel.

Referring now briefly to FIG. 8, the audio hub 102 is shown in an exploded, disassembled view, showing some of the internal components within the audio hub 102. In one embodiment, the audio hub 102 may include a mainboard 800 coupled to a plurality of daughterboards 802a-n. The number of daughterboards 802 between "a" and "n" can be any number. In one embodiment, the number of daughterboards 802 in the audio hub 102 may be eight daughterboards 802. In other embodiments, the number of daughterboards 802 in the audio hub 102 may be more or less than eight. The housing 300 may substantially enclose the mainboard 800 and the plurality of daughterboards 802a-n therein. As used herein, the term "substantially enclose" is intended to indicate an enclosure that almost completely encloses the mainboard and daughterboards therein from the outside environment, with the exception that the enclosure may define one or more nominal apertures or openings, for example, for i/o ports, fasteners, or other connections.

The mainboard 800 may be physically and communicatively coupled to each of the plurality of daughterboards 802a-n. In one embodiment, the mainboard 800 may include PCI interfaces for the daughterboards 802a-n. In another embodiment, the mainboard 800 may include PCI-e interfaces for the daughterboards 802a-n to provide more high-speed audio buses. In one embodiment, each of the plurality of daughterboards 802a-n is disposed physically parallel with one another and orientated substantially perpendicular with respect to the mainboard 800, as illustrated in the exemplary embodiment depicted in FIG. 8. In other embodiments, the plurality of daughterboards 802a-n may be physically and communicatively coupled to the mainboard 800. The term "mainboard" may also be known in the art by the terms "motherboard," "system board," "logic board," and the like. As used herein, the term "mainboard" is intended to indicate the audio hub's 102 primary printed circuit board (PCB) that provides connectors for the plurality of daughterboards 802a-n. The "mainboard" typically also includes a CPU, or other primary processing unit, memory, and other circuitry. In a preferred embodiment, the mainboard 800 is responsible for processing all the audio signals independently and managing the audio traffic within and between independent audio channels. In other words, the mainboard 800 may be configured to independently modify audio signals associated with each audio channel and may selectively combine audio signals according to user commands. Accordingly, the mainboard 800 preferably includes a very high-speed processing unit. In one embodiment, the mainboard 800 includes a digital signal processor (DSP). In further embodiments, the mainboard 800 also includes other supporting components, such as, for example, a power connector, LED indicators, i/o ports for receiving audio signals from musical instruments, network cards, a BIOS, etc.

The term "daughterboard" may also be referred to in the art as "daughtercard," "mezzanine board," "piggyback board," or the like. As used herein, the term "daughterboard" is intended to indicate a circuit board that is an extension board of the mainboard 800 and includes communication devices, such as, for example, a transceiver and an audio bus, that establish an independent audio channel of the audio hub 102 through which audio and other data communications are transmitted and received.

Each of the plurality of daughterboards 802a-n may be associated with a single independent audio channel. In other words, each audio channel associated with a daughterboard 802 is independent from the other audio channels associated with the other daughterboards 802. Stated yet another way, each audio channel associated with the audio hub 102 can be independently modified by the audio hub 102 so that each resulting audio signal transmitted to the corresponding audio playback device 108 (FIG. 1) can be a unique sound, as compared with the other audio channels. Advantageously, musicians (and producers) can uniquely modify the audio signal routed to their respective audio playback device 108 (e.g., headset). This allows each musician (or producer) to, for example, adjust the volume for his/her headset, apply a sound effect to the audio signal (e.g., synthesizer), adjust the gain, etc., without such modifications/adjustments to also be applied to the other audio signals transmitted to the headsets of the other participating musicians. Musicians can thus rehearse "silently" with a unique audio sound (as compared with the other musicians participating in the rehearsal) tailored to their personal tastes and preferences.

Figure 9:
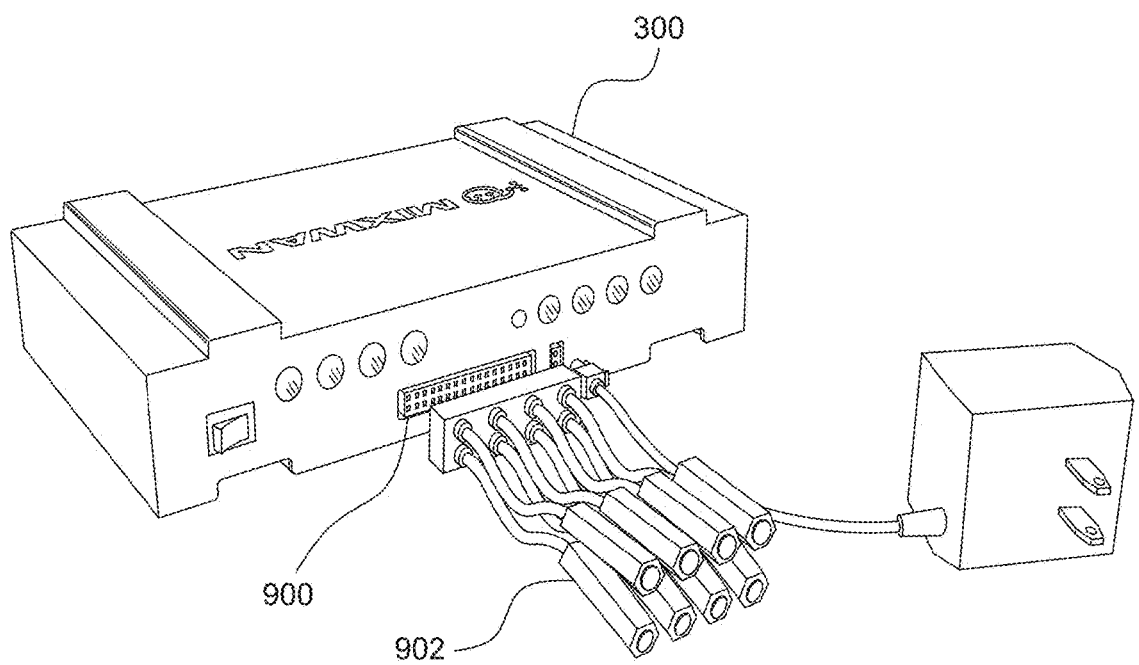
FIG. 9 is a perspective rear view of the exemplary audio hub of FIG. 3 with a MOLEX adapter, in accordance with the present invention.

This feature and related features can be described in further detail with reference to FIGS. 9 and 10. FIG. 9 illustrates a plurality of audio input ports 900 disposed on the housing 300 of the audio hub 102 in a rear perspective view. Each of the audio input ports 900 is operably configured to receive an audio signal from a musical instrument 106. In one embodiment, each of the audio input ports 900 is disposed as a physically separate input port on the housing 300. In another embodiment, the plurality of audio input ports 900 may be formed as a single connector 900, as illustrated in FIG. 9, for a more convenient and efficient connection. In one embodiment, the connector 900 can be formed as a MOLEX connector. The MOLEX connector 900 may provide an efficient snap connection. The MOLEX connector 900 may be made of a polymer material, such as, plastic.

In one embodiment, each musical instrument 106a-n may be connected directly to each of the plurality of audio input ports 900. In another embodiment, as shown in FIG. 10, each musical instrument 106a-n may be connected to a mixer 1000 and the audio signals routed through the mixer 1000 to the audio hub 102. In one embodiment, each audio input port 900 may be operably configured to receive at least one conductor 1002a-n on which the audio signal from the corresponding musical instrument 106 is transmitted to the audio hub 102. In one embodiment, an adapter plug set 902 may allow multiple conductors 1002 connected to the adapter plug set 902 to be quickly connected through a snap connection. The conductors 1002 may be, for example, wires, cables, ribbons, etc. The number of conductors and audio input ports between "a" and "n" can be any number.

In one embodiment, the connections between the musical instruments 106a-n to the mixer 1000 and the connections between the mixer 1000 and the audio hub 102 are wired connections. In such an embodiment, a "clean" audio signal generated by the musical instrument 106 may be transmitted through a wired connection to the mixer 1000. In one embodiment, the clean audio signal is processed by the mixer 1000 before being independently routed to the audio hub 102. In an alternative embodiment, the clean audio signal is the audio signal that is transmitted to the audio hub 102 through the conductors 1002. In other words, the mixer 1000 merely passes on the same clean (unmodified) audio signal from the musical instrument 106 to the audio hub 102. Each independent audio signal from one of the musical instruments 106 is transmitted through a corresponding audio input port 900 disposed on the audio hub 102.

The mixer 1000 may also be referred to in the art as "a mixing console," "mixing board," "audio mixer," "mixing desk," or "sound mixer." The term "mixer" can be considered to indicate an electronic device for combining, routing, recording, and/or modifying audio signals from instruments connected to it.

Once the audio signal arrives at the audio hub 102, via the audio input port 900, the audio hub 102 can be considered to provide an independent audio bus for each musical instrument 106. Each audio signal is transmitted to the mainboard 800. The mainboard 800 may be configured so that, for each of the plurality of daughterboards 802a-n, the mainboard 800 is operable to independently modify at least one characteristic of the audio signal from the musical instrument 106 before the audio signal is transmitted to the corresponding daughterboard 802. In one embodiment, the daughterboard 802 transmits the audio signal to the corresponding audio playback device 108a-n. The mainboard 800 may be able to keep track of each audio signal and ensure that the audio signal is routed to the corresponding daughterboard 802. The characteristic of the audio signal that can be modified can be any audio characteristic, such as volume, gain, audio effects, etc. In some embodiments, the user may choose not to modify the clean audio signal in which case the clean audio signal is routed to its corresponding daughterboard 802 without modification.

In one embodiment, the mainboard 800 may be operable to selectively combine one or more of the independently modified audio signals into a mixed (or partially mixed) audio signal according to a user command. For example, the user may desire to listen to only his own audio signal and the drums, while not listening to any of the other musical instruments during the rehearsal. In one embodiment, the mainboard 800 may be operable to transmit the mixed (or partially mixed) audio signal to at least one of the plurality of daughterboards 802a-n for wireless transmission of the mixed audio signal over a network 1004. This feature of the mainboard 800 to selectively mix audio signals may also be useful for producers who may want to listen to a mixed audio signal of all of the musicians. Advantageously, embodiments of the mainboard 800 may be adaptable to selectively, upon a user's command, mix a portion of the plurality of audio signals together (e.g., the drums and the guitar) to form a new partially mixed audio signal, or selectively, upon a user' command, mix all of the audio signals together for a producer user. This allows each user's audio playback to be uniquely customized for the user.

Figure 12:
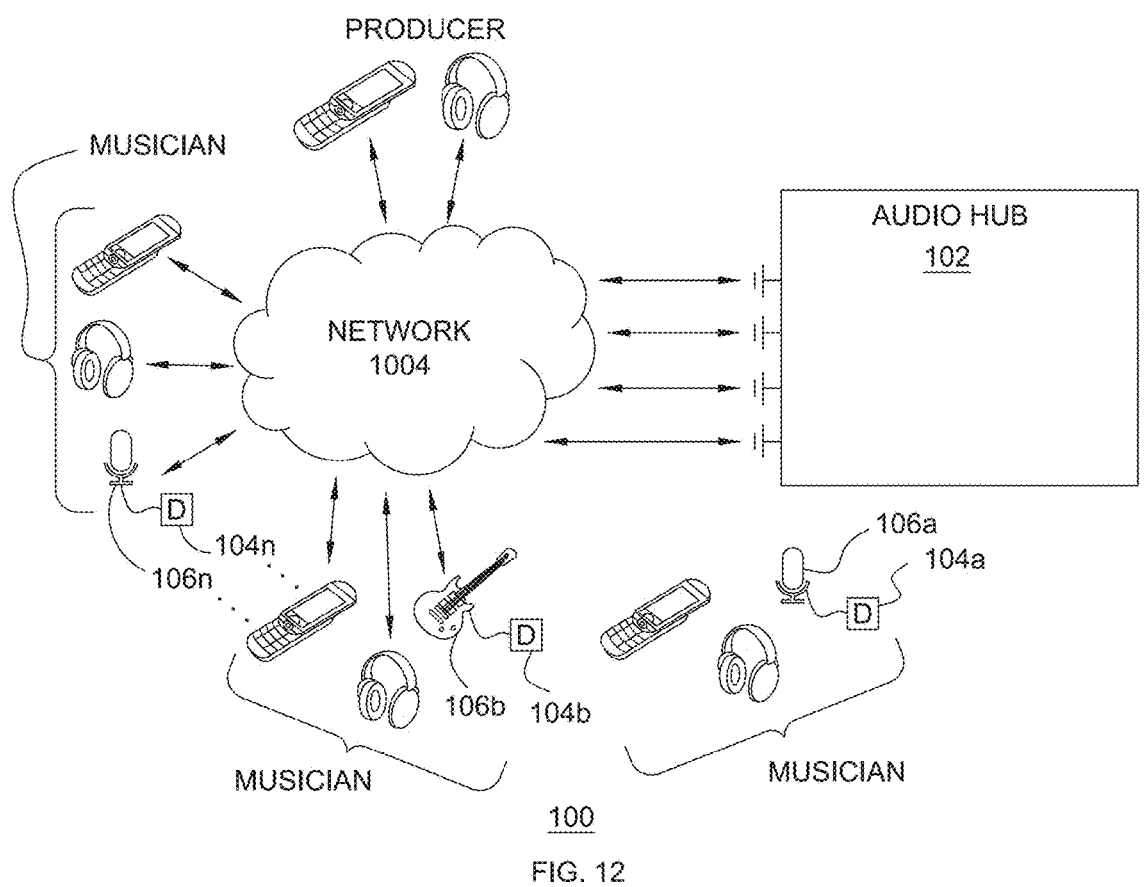
FIG. 12 is a block diagram view of yet another exemplary distributed data processing network utilizing dongles in accordance with the present invention.

In one embodiment, the daughterboard 802 establishes a two-way communication channel. It can receive audio signals from a musical instrument connected to the audio hub 102 via a wired connection and transmit such audio signals out to the corresponding audio playback device 108 over the network 1004, as illustrated in FIG. 10. It may also be configured to receive audio signals from a musical instrument connected to the network 1004 and then transmit the audio signals to the mainboard 800 for selective audio signal modification (e.g., volume control, gain settings, audio effects, etc.) by the mainboard 800, after which the mainboard 800 would against transmit the modified audio signal back to the daughterboard 802 for transmission to the audio playback device 108 over the network 1004, as illustrated in FIG. 12. Accordingly, each of the plurality of daughterboards 802 is considered to be communicatively couplable to a musical instrument 106 (for receiving audio therefrom) and an audio playback device 108 (for transmitting audio thereto). The network 1004 may be a wireless network, such as the Internet, a Bluetooth network, or a local area network (LAN). In other embodiments, the network 1004 may include other types of networks, such as, for example, a cellular network.

Figure 10:
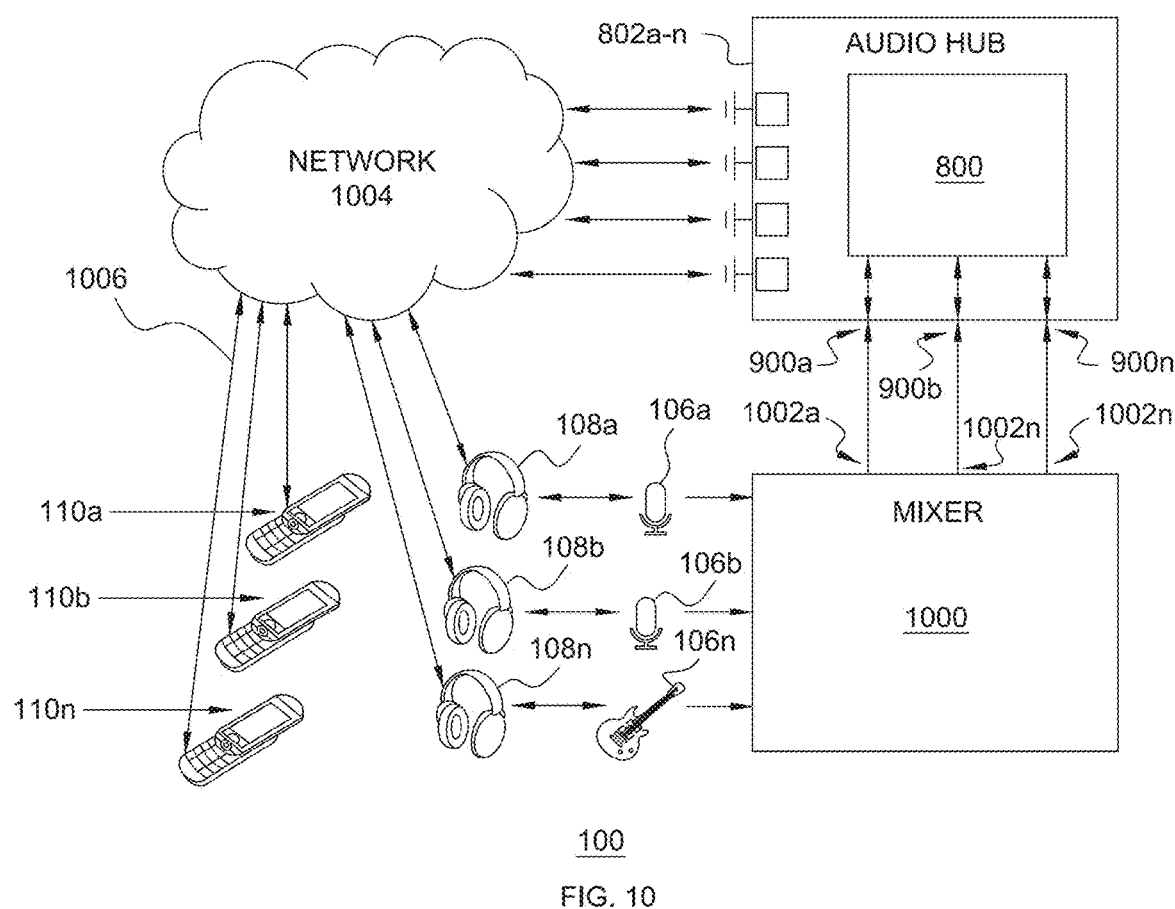
FIG. 10 a block diagram view of an exemplary distributed data processing network utilizing a mixer in accordance with the present invention.
Figure 11:
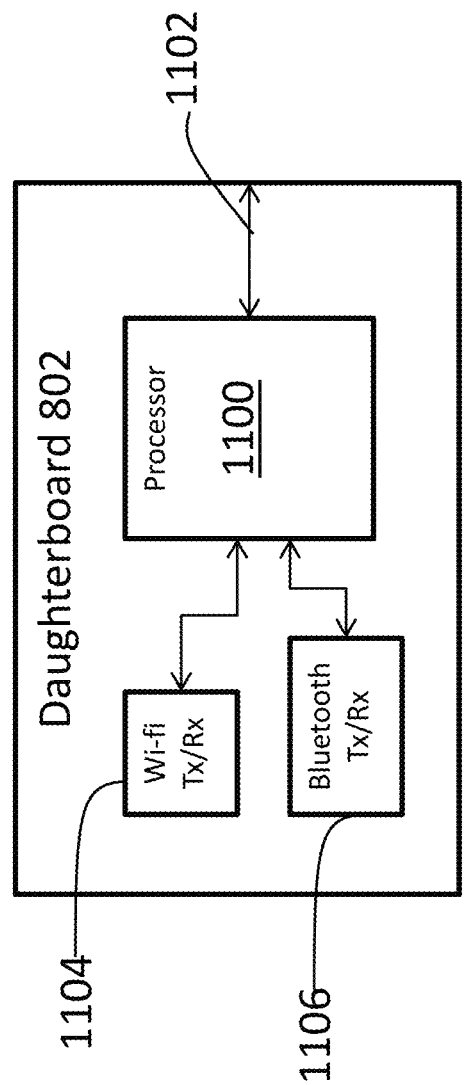
FIG. 11 is a block diagram view of an exemplary daughterboard in accordance with the present invention.

Referring briefly to FIG. 11, with reference also to FIG. 10, each daughterboard 802 may include a processor 1100 operable to communicate with the mainboard 800 via an independent audio bus 1102. In one embodiment, where audio signals are wirelessly received by the audio hub 100, the audio bus 1102 may transmit the wirelessly received audio signals associated with the corresponding musical instrument 106 to the mainboard 800 for processing by the mainboard's processor. In an additional embodiment, the audio bus 1102 may also transmit other data or control signals, such as, microphone audio from microphones associated with the audio playback device 108 and user command signals, such as, what audio characteristics to modify (e.g., volume) and how to modify them (e.g., increase volume).

Each daughterboard 802 may also include at least one wireless transceiver 1104. The wireless transceiver 1104 may be a radio frequency (RF) transceiver. The wireless transceiver 1104 may, in some embodiments, be a wireless transceiver unit, with both an RF transmitter and a separate RF receiver. Where the term "transceiver" is used herein, it is understood that the term is intended broadly to, for example, encompass a transmitter, a receiver, or, a component that includes both a transmitter and a separate receiver. In a preferred embodiment, each daughterboard 802 includes at least two wireless transceivers 1104 and 1106. The wireless transceiver 1104 may be a Wi-fi transceiver communicatively coupled to the Internet or a Wi-fi network and operable to communicate with a Wi-fi protocol. The wireless transceiver 1106 may be operable to provide a Bluetooth connection for short-range wireless communications, using a Bluetooth protocol, with the corresponding audio playback device 108, and, in some embodiments, the musical instrument 106.

The wireless transceivers 1104 and/or 1106 may be operably configured to wirelessly transmit the audio signal associated with the corresponding audio channel from the corresponding musical instrument 106 over the network 1004 to the corresponding audio playback device 108. Each of the audio hub's 102 daughterboards 802*a-n*, the mobile devices 110*a-n*, and the audio playback devices 108*a-n* may be communicatively coupled to one another over the network 1004 via connections 1006, which may be wired and/or wireless connections. For the sake of clarity, only one of the connection lines to the network 1004 has been identified as 1006. However, it is understood that there may be connections 1006 between the network 1004 and each of the devices 802*a-n*, 110*a-n*, 108*a-n*. In a preferred embodiment, such connections are wireless and may include Wi-fi connections and/or Bluetooth connections. Each of the mobile devices 110*a-n* may be considered a personal mobile device for each musician/producer. Such users may transmit user commands wirelessly over the network 1004 from a software application running on the mobile device 110. Such user commands are preferably received by the corresponding daughterboard 802 and, more particularly, by the wireless transceiver 1104. The daughterboard 802 may send the user commands to the mainboard 800 to command the mainboard's 800 CPU to independently modify the user's audio signals based on such user commands.

Referring again to FIG. 2, the process proceeds to step 204, where the dongle 104 is provided for each musician. In one embodiment, the producer may provide a dongle 104 for each musician. In another embodiment, each musician may independently obtain his/her dongle 104.

Referring now to FIG. 12, in an embodiment where the dongle 104 is provided for each musician, another exemplary network architecture for the audio hub system 100 may result, as presented in a block diagram view. The dongle 104 eliminates the need for a mixer and/or a wired connection from the musical instrument 106 to the audio hub 102, illustrated by the network diagram of FIG. 10. Accordingly, via the dongle 104, the audio signals from the musical instruments 106 can be transmitted wirelessly, over the network 1004. In some embodiments, the audio signals from the musical instruments 106 may be transmitted over, for example, a Bluetooth network and/or a Wi-fi network, to the audio hub 102.

Figure 13:
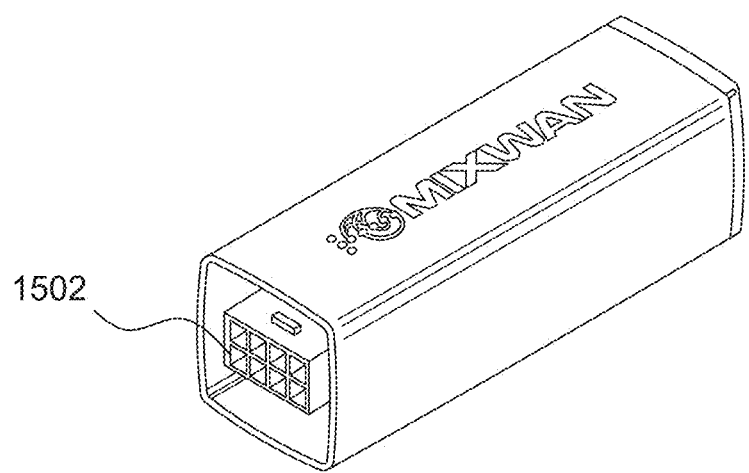
FIG. 13 is a front perspective view of an exemplary dongle in accordance with an embodiment of the present invention.
Figure 14:
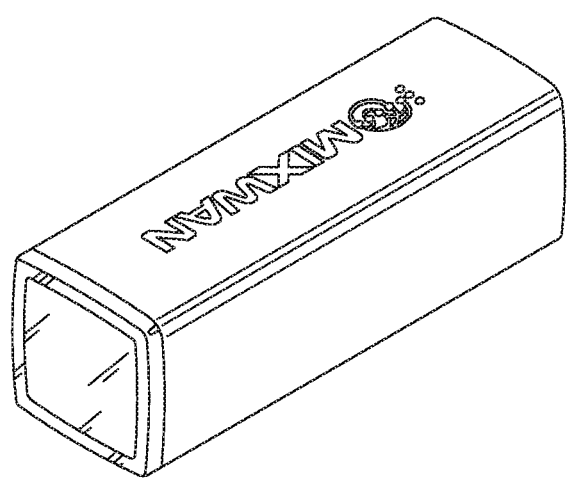
FIG. 14 is a rear perspective view of the exemplary dongle of FIG. 13 in accordance with the present invention.
Figure 15:
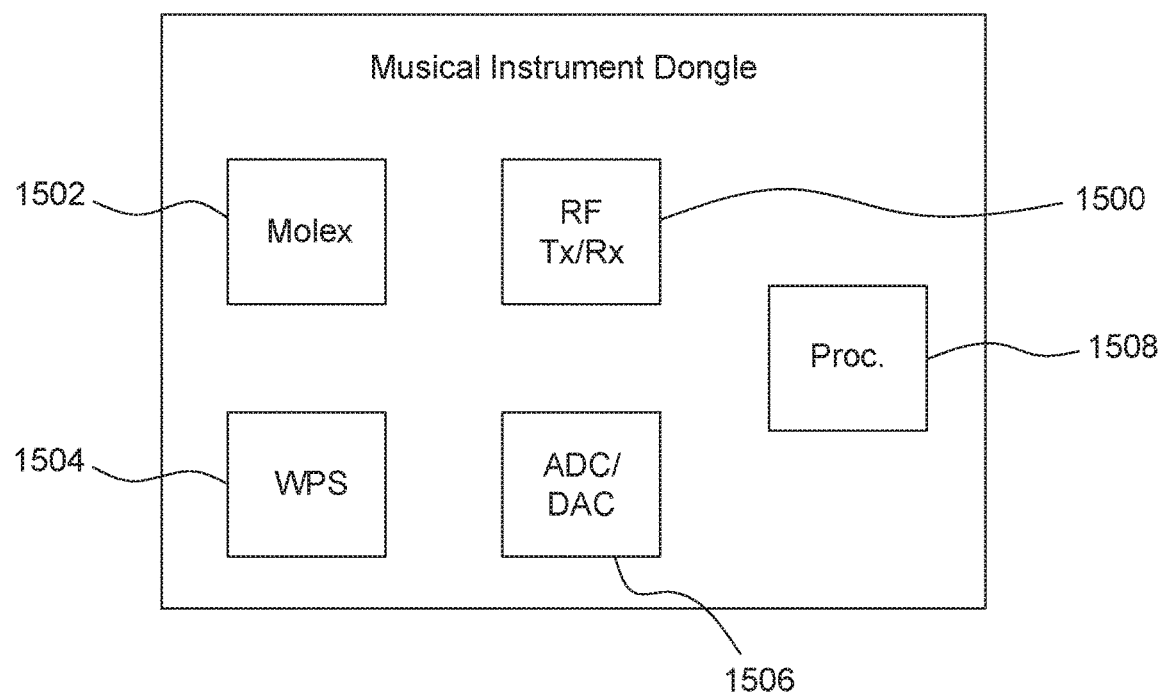
FIG. 15 is a block diagram view of the exemplary dongle of FIG. 13 in accordance with the present invention.

Referring now to FIGS. 13-15, with reference to FIG. 1, the exemplary dongle 104 is shown in a front perspective view, a rear perspective view, and a block diagram view, respectively. The dongle 104 may be of a relatively small form factor. In one embodiment, the dongle 104 may be sized and shaped to be held within the user's palm. In other embodiments, the dongle 104 may be formed as other shapes and sizes. The dongle 104 may include at least one transceiver 1500, such as an RF transceiver/transceiver. The transceiver 1500 may be a Wi-fi transceiver communicatively coupled to the Internet or a Wi-fi network and operable to communicate with a Wi-fi protocol, to the audio hub 102. The transceiver 1500 may be operable to provide a Bluetooth connection for short-range wireless communications, using a Bluetooth protocol, with the audio hub 102. In a preferred embodiment, the dongle 104 includes two wireless transceivers 1500, a first wireless transceiver operably configured to communicate with a Bluetooth protocol and a second wireless transceiver operably configure to communicate with a Wi-Fi protocol.

Figure 16:
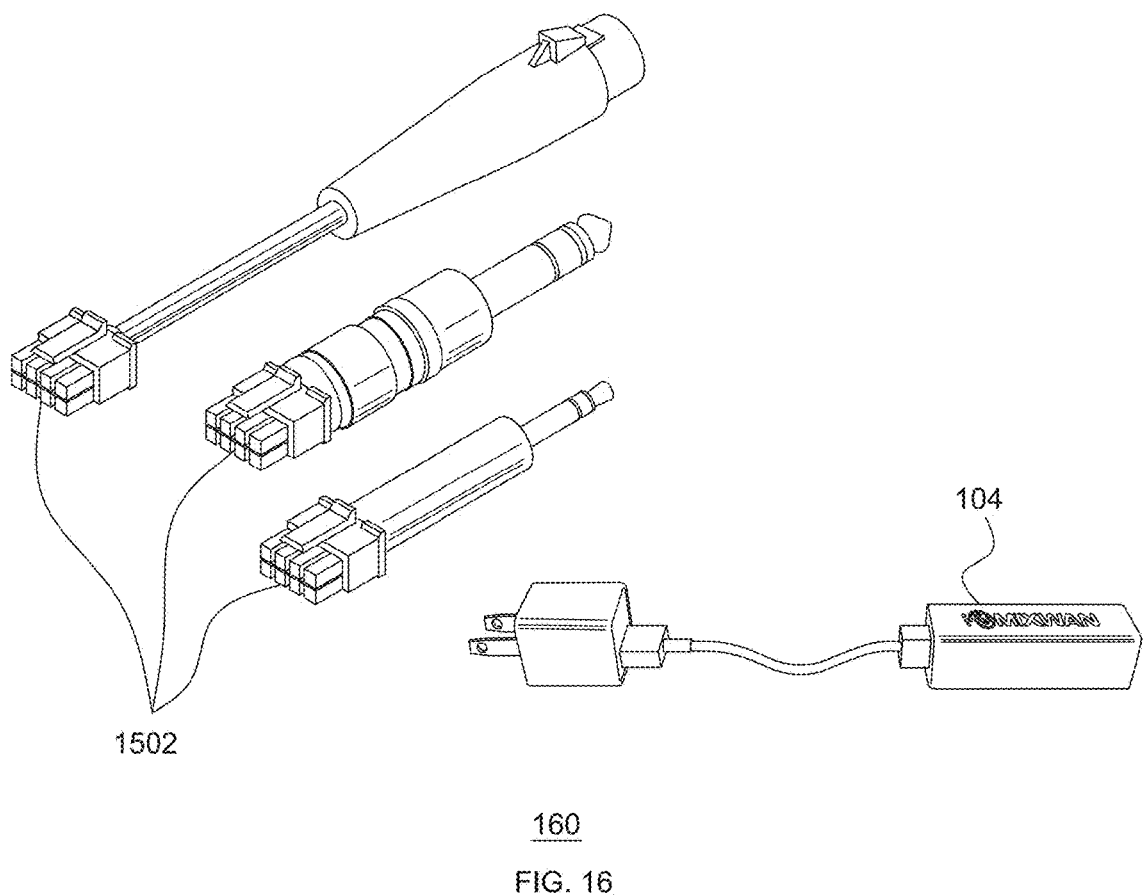
FIG. 16 is a front perspective view of a plurality of MOLEX adapters configured to connect the dongle of FIG. 13 to a musical instrument in accordance with an embodiment of the present invention.

The dongle 104 is configured to couple to the musical instrument 106. In one embodiment, the dongle 104 includes a MOLEX connector 1502. In order to connect the dongle 104 to various musical instrument audio output ports (e.g., ¼" audio jack, etc.), various MOLEX adapters 1600 (see FIG. 16) may be provided that are configured to plug-in to different types of audio output ports. Advantageously, the MOLEX connector 1502 provides a quick and efficient snap connection configuration. In other embodiments, the dongle 104 may include other types of known connectors that are couplable to the musical instruments 106.

In one embodiment, the dongle 104 includes a WPS button 1504. The WPS button 1504 may be disposed on an exterior surface of the dongle 104 and may allow the user to enable a Wi-fi connection. The dongle 104 may also include a ADC/DAC (analog-to-digital converter/digital-to-analog converter) 1506. The ADC/DAC 1506 may convert the analog audio signal from the musical instrument 106 into a digital signal that can be transmitted wirelessly, over a Bluetooth or a Wi-fi network, to the audio hub 102 for processing. In order to minimize delay, the ADC/DAC 1506 is preferably operable to convert analog signals to digital signals at relatively high speeds (e.g., 320 khz). In another embodiment, the dongle 104 may include a processor 1508. The processor 1508 may be considered a microcontroller, microprocessor, or other data processing device. In one embodiment, the processor 1508 may be configured to encode or encrypt the audio data before the data is transmitted to the audio hub 102 for secure wireless communications.

In step 206, each user (i.e., musician and/or producer) may create a user account and register his/her devices (audio playback device 108, dongle 104, and/or mobile device 110) with his/her unique user account. In one embodiment, the user may create a unique username and password associated with his/her user account that the user can use to log-in to receive access to his/her user account. The user may download a software application 112 that allows the user to access his/her account via the user's mobile device 110. During a rehearsal session, each audio channel may be dedicated to transmitting/receiving audio signals associated with only one set of user devices associated with a user account. For example, one audio channel may only receive audio signals from the dongle 104 associated with the guitarist's user account and may only allow for the transmission of audio signals to the audio playback device 108 associated with the guitarist's user account. This may be implemented by the daughterboard 802 (FIG. 11) via the wireless transceiver 1104 and/or 1106. Users may register their devices by providing (or allowing the software application to obtain) a unique alphanumeric code associated with their respective devices (e.g., MAC address, serial no., etc.). This unique code may also be used for encryption/decryption purposes. In one embodiment, the dongle 104 may include a unique identifier (e.g., serial no.) that may be stored in its non-transitory memory and the daughterboard 802 associated with the dongle 104 may be configured to only receive data from a dongle that provides the unique identifier as, for example, an encryption key or other type of passcode.

In one embodiment, each user's mobile device 110 may run an instance of the software application, with each instance associated with the user's user account. In a further embodiment, each user account may be associated with or assigned to one of the daughterboards 802. The associated daughterboard 802 may be dedicated to receiving from and transmitting data (e.g., audio signals, commands) to only the user's registered devices, during a rehearsal session.

Figure 17:
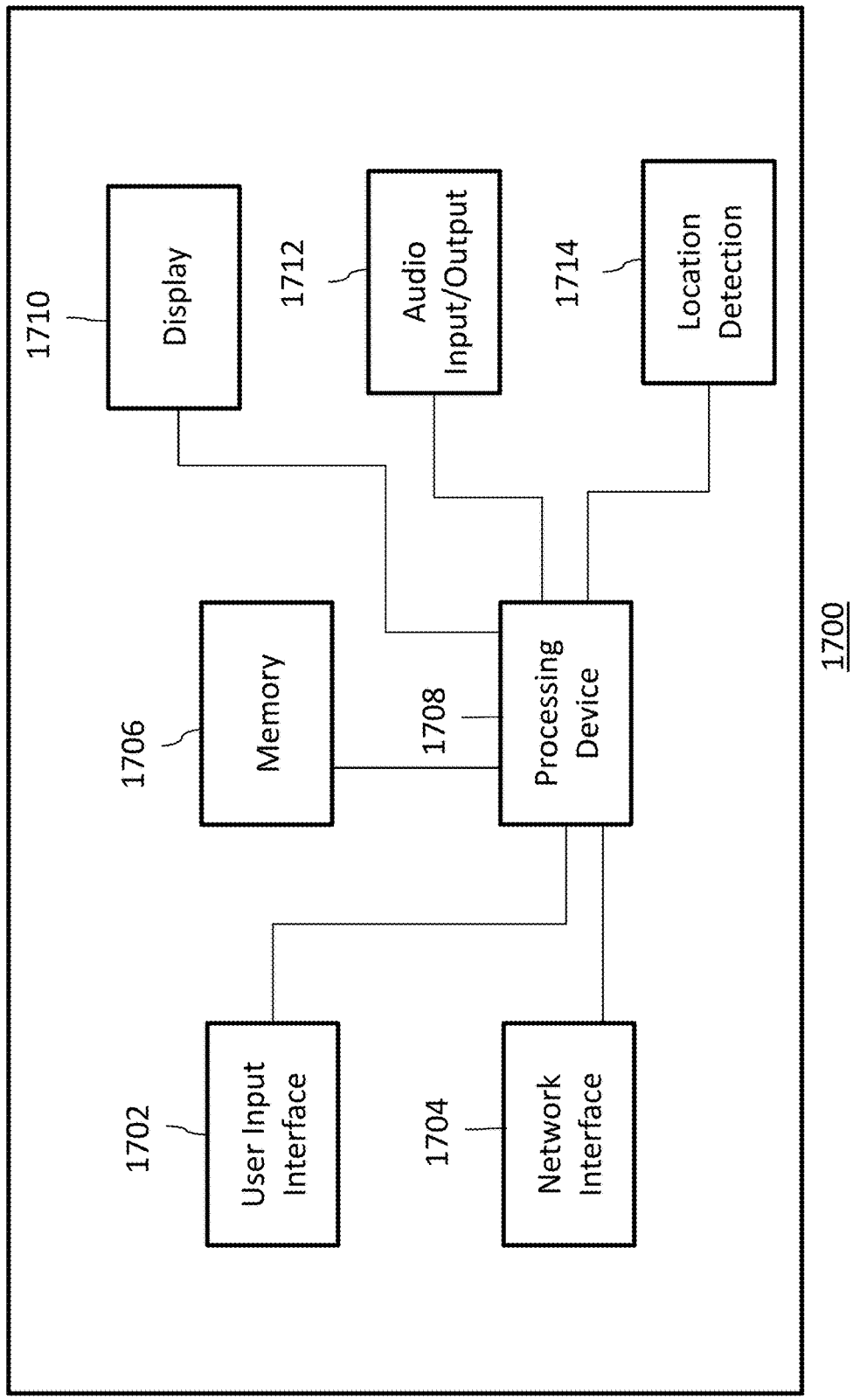
FIG. 17 is a block diagram view of an exemplary user mobile device in accordance with an embodiment of the present invention.

Referring now briefly to FIG. 17, an exemplary electronic mobile device 1700 is illustrated in a block diagram. The exemplary electronic mobile device 1700 includes a user input interface 1702, a network interface 1704, memory 1706, a processing device 1708, a display 1710, an audio input/output 1712, and a location detection device 1714.

The user input interface 1702 functions to provide a user a method of providing input to the electronic mobile device 1700. The user input interface 1702 may also facilitate interaction between the user and the device 1700. The user input interface 1702 may be a keypad providing a variety of user input operations. For example, the keypad may include alphanumeric keys for allowing entry of alphanumeric information (e.g. serial no., password, username, contact information, text, etc.). The user input interface 1702 may include special function keys (e.g. a camera shutter button, volume control buttons, back buttons, home button, etc.), navigation and select keys, a pointing device, and the like. Keys, buttons, and/or keypads may be implemented as a touchscreen associated with the display 1710. The touchscreen may also provide output or feedback to the user, such as haptic feedback or orientation adjustments of the keypad according to sensor signals received by motion detectors, such as an accelerometer, located within the device 1700.

The network interface 1704 may include one or more network interface cards (NIC) or a network controller. In some embodiments, the network interface 1704 may include a personal area network (PAN) interface. The PAN interface may provide the capability for the electronic mobile device 1700 to network using a short-range communication protocol, for example, a Bluetooth communication protocol. The PAN interface may permit one electronic mobile device 1700 to connect wirelessly to another electronic mobile device 1700 via a peer-to-peer connection.

The network interfaces 1704 may also include a local area network (LAN) interface. The LAN interface may be, for example, an interface to a wireless LAN, such as a Wi-Fi network. In one embodiment, there is a wireless LAN located at or near the audio hub 102 or the musical instruments 106. The range of the LAN interface may generally exceed the range available via the PAN interface. Typically, a connection between two electronic devices via the LAN interface may involve communication through a network router or other intermediary device.

Additionally, the network interfaces 1704 may include the capability to connect to a wide area network (WAN) via a WAN interface. The WAN interface may permit a connection to a cellular mobile communications network. The WAN interface may include communications circuitry, such as an antenna coupled to a radio circuit having a transceiver for transmitting and receiving radio signals via the antenna.

The radio circuit may be configured to operate in a mobile communications network, including but not limited to global systems for mobile communications (GSM), code division multiple access (CDMA), wideband CDMA (WCDMA), and the like.

The electronic mobile device 1700 may also include a near field communication (NFC) interface. The NFC interface may allow for extremely close range communication at relatively low data rates (e.g., 424 kb/s). The NFC interface may take place via magnetic field induction, allowing the NFC interface to communicate with other NFC interfaces located on other electronic mobile devices 1700 or to retrieve information from tags having radio frequency identification (RFID) circuitry. The NFC interface may enable initiation and/or facilitation of data transfer from one electronic mobile device 1700 to another electronic device 1700 with an extremely close range (e.g. 4 centimeters).

Memory 1706 associated with the device 1700 may be, for example, one or more buffer, a flash memory, or non-volatile memory, such as random access memory (RAM). The electronic mobile device 1700 may also include non-volatile storage. The non-volatile storage may represent any suitable storage medium, such as a hard disk drive or non-volatile memory, such as flash memory.

The processing device 1708 can be, for example, a central processing unit (CPU), a microcontroller, or a microprocessing device, including a "general purpose" microprocessing device or a special purpose microprocessing device. The processing device 1708 executes code stored in memory 1706 in order to carry out operation/instructions of the electronic mobile device 1700. The processing device 1708 may provide the processing capability to execute an operating system, run various applications, and provide processing for one or more of the techniques described herein.

The display 1710 displays information to the user such as an operating state, time, telephone numbers, various menus, application icons, pull-down menus, and the like. The display 1710 may be used to present various images, text, graphics, or videos to the user, such as photographs, mobile television content, Internet webpages, and mobile application interfaces. The display 1710 may be any type of suitable display, such as an liquid-crystal display (LCD), a plasma display, a light-emitting diode (LED) display, or the like.

The electronic mobile device 1700 may include audio input and output structures 1712, such as a microphone for receiving audio signals from a user and/or a speaker for outputting audio data, such as audio alerts, songs, ringtones, video tracks, voice data received by the electronic mobile device 1700 over a cellular network, and the like. The electronic mobile device 1700 may also include an audio port for connection to peripheral audio input and output structures, such as a headset.

The location detection device 1714 may be associated with a global positioning system (GPS) or other location sensing technologies. The electronic mobile device 1700 may have a GPS transceiver or the like, to determine the location of the electronic mobile device 1700.

In step 208, each user logs-in to his/her account via the software application 112 running on his/her respective mobile device 110. Each user may connect his/her musical instrument 106 to the audio hub 102, via a wired connection (see, for example, FIG. 10) or via a wireless connection (see, for example, FIG. 12) by connecting the dongle 104 to the musical instrument 106. Each user may couple his/her audio playback device 108 to the audio hub 102 via a wired connection or a wireless connection over a Bluetooth network or a Wi-fi network, for example. The audio playback device 108 may include a microphone that allows the user to converse with other users over the network 1004, via the audio hub 102 (or more particularly, the daughterboard 802). In other words, the microphone output from the audio playback device 108 may be received by the associated daughterboard 802 in addition to the audio signal from the musical instrument 106. The daughterboard 802 may be operably configured to segregate the microphone output from the musical instrument output. Both outputs may be transmitted to the mainboard 800 that decides on which audio channels the microphone output should be transmitted over and also decides what, if any, modifications are to be made to the musical instrument output and over which audio channel(s) to transmit the musical instrument audio. For example, a user may select to receive microphone output from the producer's microphone, but may select to ignore any microphone output from any of the other rehearsal participants. Alternatively, the user may select to receive all microphone outputs or a subset of the microphone outputs. During a rehearsal session, each user's devices may be assigned to a single audio channel on the audio hub 102 over which to send and receive audio signals and user-commands (e.g., increase my volume, apply a synthesizing audio effect, listen to only the producer and the soloist's headset microphone output).

In one embodiment, only one user account may be considered a producer user account. In step 210, the producer user account may be configured to allow the producer to select the settings for the rehearsal session. The producer user account may allow the producer to select users that may participate in the rehearsal. The producer user account may allow the producer to select various audio characteristics for each user's audio signals. The producer may initiate and terminate recording of the rehearsal session through the producer's user account. The recording may be a mixed audio signal recording and may be stored on a server system that manages and services the user accounts and/or may be stored on the producer's mobile device 110. In yet another embodiment, the audio hub 102 may store the mixed recording on a memory resident in the audio hub 102. In a further embodiment, the mixed audio recording may only be accessible by a limited subset of rehearsal participants with permission (e.g., producer and soloist). In other embodiments, the mixed audio recording may be accessible by all user accounts associated with each rehearsal participant. Advantageously, mixed audio recordings may be made with embodiments of the present invention so as to allow musicians located far away from each other to rehearse and record over long distances, while at the same time, allowing each musician and producer to listen to his/her own independent version of the audio rehearsal. In one embodiment, producer-commands transmitted from the producer user account may be operable to override musician user-commands to modify an audio characteristic of the audio signal. Accordingly, producers can have overriding control over the audio characteristics and qualities of the audio signals of the group, individually, and, as a whole (in a mixed version of the audio).

In step 212, each musician plays the musical instrument during the rehearsal session to generate a clean audio signal. For example, a vocalist may sing a note into a microphone; a guitarist may strum his guitar, etc. Each musician's audio signal may be transmitted to the audio hub 102 on the musician's dedicated audio channel. More specifically, each musician's audio signal may be transmitted to the corresponding daughterboard 802 in the audio hub 102.

In step 214, the musician may selectively modify his/her clean audio signal, via the musician's mobile device 110, by selecting a modification provided through the user interface associated with the software application 112. As a result of the user selecting the modification, the musician's mobile device 110 may transmit the selected modification/user-command from the mobile device 110 to the audio hub 102 to independently modify an audio characteristic of the audio signal.

In step 216, the audio hub 102 performs the user-selected audio modification on each audio signal independently. In other words, each user may select a modification and the audio hub 102 is operable to independently modify each audio signal corresponding to the user. More specifically, in one embodiment, each daughterboard 802 transmits the clean audio signal to the mainboard 800 over the corresponding audio bus 1102 and the mainboard 800 may apply the modifications to the audio signal (e.g., volume control, synthesizer effects, increase gain, apply reverb, or apply any other known audio effect). Subsequently, the mainboard 800 may transmit the modified audio signal to the corresponding daughterboard 802.

In step 218, the audio hub 102 may transmit each audio signal to the corresponding audio playback device 108. More specifically, each daughterboard 802 may transmit the corresponding audio signal on its associated audio channel to the corresponding audio playback device 108. In step 220, the rehearsal session may either continue to step 212, where the process repeats and the musicians continue to play, or, alternatively, the rehearsal may terminate and the process may end at step 222.

A novel and efficient audio hub and associated process has been disclosed that facilitates wireless transmission of audio signals from instruments connected to the audio hub to user headsets. Embodiments of the invention may provide an audio hub that is configured to transmit audio signals from instruments wirelessly to user headsets for silent rehearsals. In addition, embodiments of the present invention provide an audio hub with a plurality of daughterboards, each daughterboard associated with an independent audio channel and may be further associated with a corresponding user headset/headphones, a corresponding user instrument, and/or a corresponding user mobile device. In a further embodiment, each user mobile device runs an instance of a software application with a unique user account that allows the user to modify the user's audio channel output to the user's headset (e.g., turn up the user's volume, or modify the user's audio to playback with an increased gain, etc.) during the silent rehearsal. In other words, each user's headset may receive an independent audio signal that the user can selectively modify through his/her mobile device (and which may not affect the audio signal received by any of the other musician's headsets). In a further embodiment, each daughterboard is communicatively coupled to a main board, via a corresponding wired audio bus, that processes the audio signals on each independent audio channel and is operable to independently modify each independent audio signal (e.g., volume, gain, etc.) and transmit such modified audio signal to the corresponding daughterboard for transmission to the corresponding user's headset.

What is claimed is:

1. An audio hub comprising:
a plurality of daughterboards, each of the plurality of daughterboards:
associated with an audio channel and each audio channel is independent from audio channels associated with other ones of the plurality of daughterboards;

configured to communicatively couple to a musical instrument and an audio playback device; and
including at least one wireless transceiver configured to wirelessly transmit an audio signal associated with the audio channel from the musical instrument over at least one of the Internet or a LAN to the audio playback device; and
a mainboard communicatively coupled to each of the plurality of daughterboards and configured so that, for each of the plurality of daughterboards, the mainboard is configured to independently modify at least one characteristic of the audio signal from the musical instrument before the audio signal is transmitted to the audio playback device.

2. The audio hub in accordance with claim 1, further comprising:
a stackable housing substantially enclosing the mainboard and the plurality of daughterboards, the stackable housing including an exterior surface portion shaped to matingly engage at least one mating surface portion disposed on an adjacent audio hub.

3. The audio hub in accordance with claim 1, further comprising:
a housing substantially enclosing the mainboard and the plurality of daughterboards; and
a plurality of audio input ports disposed on the housing, each audio input port operably configured to receive at least one conductor couplable to a mixing board.

4. The audio hub in accordance with claim 1, wherein:
the mainboard is further configured to selectively combine at least a portion of the independently modified audio signals into a mixed audio signal and transmit the mixed audio signal to at least one of the plurality of daughterboards for wireless transmission of said mixed audio signal over the at least one of the Internet and the LAN.

5. The audio hub in accordance with claim 4, wherein:
the mainboard is further operable to, for each of the plurality of daughterboards, independently modify the at least one characteristic of the audio signal associated with the corresponding audio channel as a result of a user command wirelessly received via a software application running on a mobile device corresponding to the daughterboard, the mobile device wirelessly communicatively coupled to the audio hub.

6. The audio hub in accordance with claim 1, wherein:
each of the plurality of daughterboards is operable to receive a microphone output from a corresponding audio playback device in addition to the audio signal from a corresponding musical instrument.

7. The audio hub in accordance with claim 1, wherein:
each of the plurality of daughterboards is disposed physically parallel with one another and oriented substantially perpendicular with respect to the mainboard.

8. The audio hub in accordance with claim 1, wherein:
the at least one wireless transceiver included in each of the plurality of daughterboards includes a first wireless transceiver communicating with a Bluetooth protocol and a second wireless transceiver communicating with a Wi-fi protocol.

9. The audio hub in accordance with claim 1, wherein:
the at least one characteristic of the audio signal is a volume of the audio signal.

10. The audio hub in accordance with claim 1, wherein:
the at least one characteristic of the audio signal is at least one of a gain of the audio signal.

11. An audio hub system comprising:
a plurality of musical instrument dongles, each of the plurality of musical instrument dongles couplable to a musical instrument and including at least one transceiver configured to transmit an audio signal from the musical instrument, over at least one of the Internet and a LAN; and
an audio hub including:
a plurality of daughterboards, each of the plurality of daughterboards associated with one of the plurality of musical instrument dongles and including at least one transceiver configured to receive the audio signal from an associated musical instrument dangle over the at least one of the Internet and the LAN, and
a mainboard communicatively coupled to each of the plurality of daughterboards and configured to independently modify at least one characteristic of each audio signal received from the plurality of musical instrument dongles.

12. The system in accordance with claim 11, wherein:
each of the plurality of daughterboards is associated with one of the plurality of musical instrument dongles by a unique identifier.

13. The system in accordance with claim 12, further comprising:
a plurality of user mobile devices each running an instance of a software application, each instance of the software application associated with a user account and each user account associated with one of the plurality of daughterboards and operably configured to allow a user to transmit a user-command to independently modify the at least one characteristic of the audio signal received by the associated daughterboard over the at least one of the Internet and the LAN.

14. The system in accordance with claim 13, wherein:
only one user account is a producer user account that is operable to override the user-command with a producer-command to modify the at least one characteristic of the audio signal.

15. The system in accordance with claim 11, wherein:
the audio hub includes at least one MOLEX connector; and
each of the plurality of musical instrument dongles includes a MOLEX connector.

16. The system in accordance with claim 11, wherein:
each of the plurality of musical instrument dongles includes a WI'S button.

17. The system in accordance with claim 11, wherein:
the at least one wireless transceiver included in each of the plurality of daughterboards and each of the plurality of musical instrument dongles includes a first wireless transceiver configured to communicate with a Bluetooth protocol and a second wireless transceiver configured to communicate with a Wi-fi protocol.

18. The system in accordance with claim 11, further comprising:
a plurality of audio playback devices each configured to receive a modified audio signal from an associated daughterboard, the modified audio signal resulting from the mainboard independently modifying the at least one characteristic of the audio signal.

19. The system in accordance with claim 11, wherein:
the mainboard is further configured to selectively combine one or more of the independently modified audio signals into a mixed audio signal and transmit the mixed audio signal to at least one of the plurality of daughterboards for wireless transmission of said mixed audio signal over the at least one of the Internet and the LAN.

20. The system in accordance with claim 11, wherein:
each of the plurality of musical instrument dongles includes an analog-to-digital converter.

* * * * *